United States Patent [19]

Hsu

[11] Patent Number: 5,225,840
[45] Date of Patent: Jul. 6, 1993

[54] WIDEBAND, LOW NOISE MICROWAVE SIGNAL GENERATOR

[75] Inventor: Steve Hsu, Rancho Palos Verdes, Calif.

[73] Assignee: Hughes Aircraft Company, Los Angeles, Calif.

[21] Appl. No.: 894,898

[22] Filed: Jun. 8, 1992

[51] Int. Cl.$^5$ .................... G01S 7/282; H03L 7/00
[52] U.S. Cl. .................... 342/175; 342/82; 331/2; 455/76
[58] Field of Search ............ 342/175, 82; 331/2, 331/25; 455/76

[56] References Cited

U.S. PATENT DOCUMENTS 3,696,422 10/1972 Burrell .................... 342/385
3,757,339 9/1973 Shear et al. .................... 342/455
5,053,717 10/1991 Kuo et al. .................... 331/2
5,130,714 7/1992 Taylor .................... 342/132
5,130,717 7/1992 Ewen et al. .................... 342/375

Primary Examiner—John B. Sotomayor
Attorney, Agent, or Firm—L. A. Alkov; W. K. Denson-Low

[57] ABSTRACT

An efficient wideband low noise microwave signal generator for active radars. Separate transmit drive (TD) and receiver local oscillator (LO) signals are generated by use of a single programmable reference generator and two frequency synthesized signals separated in frequency by an offset precisely equal to the transmit drive offset. The frequency synthesized signals are respectively summed and subtracted in frequency with the reference generator signal to obtain signals which may be selected as the TD and LO signals.

9 Claims, 3 Drawing Sheets

– 1 –

WIDEBAND, LOW NOISE MICROWAVE SIGNAL GENERATOR

BACKGROUND OF THE INVENTION

The present invention relates to a very efficient frequency plan for generating microwave signals for a wide-band, low noise radar system.

In one known radar system, the LO signal is generated by summing the microwave reference and frequency synthesizer signals, as shown in FIG. The function of the microwave reference is to generate wideband X-band signals with coarse frequency steps. Because of its high output frequency the microwave reference also sets the noise performance. The frequency synthesizer generates a narrow-band signal in a frequency region of less than 2 GHz with fine frequency steps (5 to 10 MHz) Thus, summing (mixing) of the two signals will generate a wideband microwave signal with fine frequency steps. The microwave reference is the most critical component in the wideband, low noise signal generator because it sets the overall radar signal bandwidth and the frequency stability. The transmit drive (TD) signal is generated by summing a constant frequency offset (TD Offset) to the local oscillator receiver (LO). For a conventional radar system with less than 10% bandwidth, the approach of FIG. 1 can provide excellent performance.

In a very wideband application, the approach of FIG. 1 is very hardware intensive (i.e., requires duplication of hardware), and spurious signal generation due to the TD Offset is very difficult to control. The Fault Tolerant Wideband Signal Generator frequency plan of U.S. Pat. No. 5,053,722, Kuo et al. and assigned to a common assignee with the present application, is useful for a radar system that requires very wide frequency bandwidth (e.g., 45%). U.S. Pat. No. 5,053,722 is incorporated herein in its entirety by this reference. In the approach of U.S. Pat. No. 5,053,722, the TD Offset is eliminated, thus reducing hardware and eliminating TD Offset spurious signal generation. The microwave reference is divided into high and low frequency bands such that the output frequencies for the two microwave references are separated by the TD Offset frequency. The outputs of the two microwave references are summed with the frequency synthesizer signal to produce the high band and the low band signals. By routing the TD signal from one band and the LO signal from another band, and interchanging bands by means of switching, it is possible to generate both TD and LO signals from a TD frequency band. In its most efficient form, the total bandwidth required from the two microwave references is approximately equal to the TD signal bandwidth minus twice the bandwidth of the frequency synthesizer.

It is therefore an object of the present invention to provide a wideband microwave signal generator wherein the required bandwidth of the microwave reference is substantially reduced, thereby reducing circuit complexity and improving the noise performance of the signal generator.

SUMMARY OF THE INVENTION

A wide-band microwave signal generator for active radars is described, characterized in that respective separate transmit drive (TD) and receiver local oscillator (LO) signals are generated. The signal generator includes a programmable frequency generator for synthesizing a reference signal having a programmable first microwave frequency. A frequency synthesizing means is provided for synthesizing two synthesized signals. The respective signals are characterized in that the sum of the frequencies of the two synthesized signals is equal to a transmit drive (TD) offset.

The signal generator further comprises first mixing means for mixing a selected one of the two synthesized signals with the reference signal to obtain a first mixer output signal whose frequency equals the sum of the respective frequencies of the reference signal and the selected synthesized signal. The generator also includes a second mixing means for mixing the other synthesized signal with the reference signal to obtain a second mixer output signal whose frequency equals the difference of the respective frequencies of the reference signal and the other synthesized signal.

A TD selection means is provided for selecting either the first mixer output signal or the second mixer output signal as the radar TD signal. A LO selection means selects either the first or the second mixer output signal as the receiver LO signal, such that the second mixer output signal is selected as the LO signal when the first mixer output signal is selected as the TD signal, and the first mixer output signal is selected as the LO signal when the second mixer output signal is selected as the TD signal.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

This invention further simplifies the frequency plan used in U.S. Pat. No. 5,053,722 by cutting the bandwidth of the equivalent microwave reference by one-half without adding any significant amount of complexity in other hardware. But more significantly, simplification in the microwave reference signal generator makes it easier to design a low noise system because the microwave reference signal generator sets the frequency stability performance.

Figure 1:
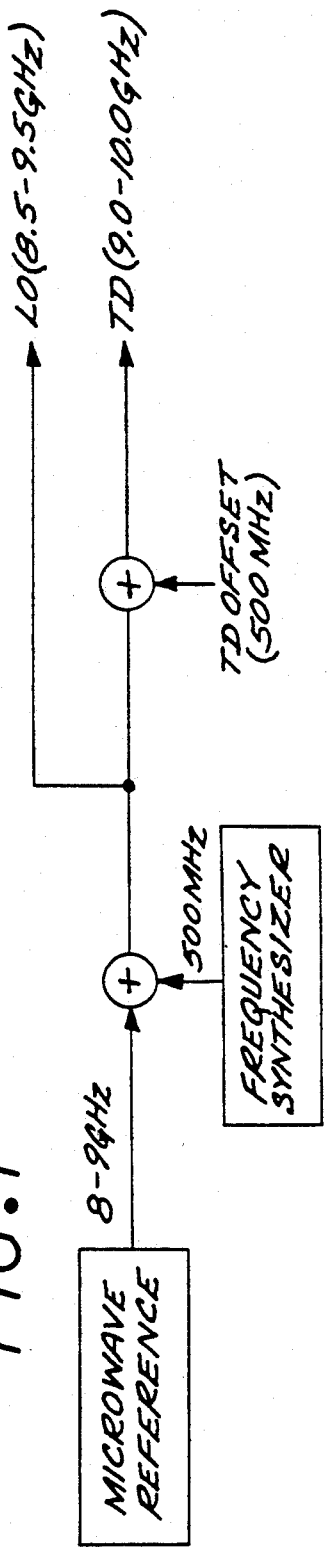
FIG. 1 is a simplified schematic diagram of a known microwave signal generator.
Figure 2:
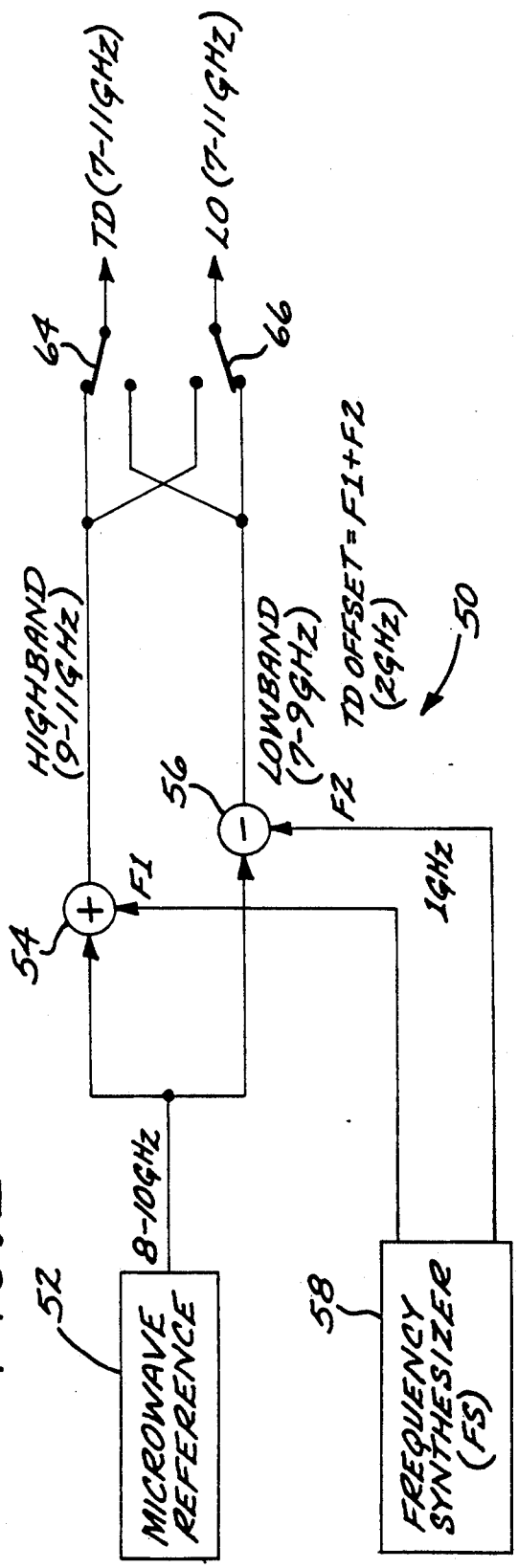
FIG. 2 is a simplified schematic diagram illustrative of a microwave signal generator embodying the present invention.

FIG. 2 shows a simplified block diagram of an exemplary embodiment of the invention. The signal generator 50 of FIG. 2 comprises a programmable microwave reference generator for generating a reference signal in the exemplary frequency range 8–10 GHz. The reference generator may comprise, for example, a generator having an architecture similar to that shown in U.S. Pat. No. 5,053,722, as the high or low band generator 70 or 60. The reference signal is fed to first and second signal mixers 54 and 56. The system 50 further comprises a frequency synthesizer which generates two synthesized signals F1 and F2. The TD offset is in the range of 2 GHz in this embodiment, and equals the sum of the frequency of the two synthesized signals F1 and F2.

The function of mixer 54 is to mix the microwave reference signal with F1, and produce a mixed signal whose frequency is equal to the sum of the frequencies of the reference signal and F1. Similarly, the function of mixer 56 is to mix the microwave reference signal with F2, and produce an output signal whose frequency is equal to the difference of the frequencies of the reference signal and F2. The output of mixer 54 is the highband signal in the range of 9-11 GHz in the embodiment, and the output of mixer 56 is the lowband signal in the range of 7-9 GHz. The outputs of the respective mixers 54 and 56 can be selected as the TD and LO signal, or vice versa, by switches 64 and 66.

The system of FIG. 2 employs the same concept of high and low band signals which are separated by the TD Offset as in the system of U.S. Pat. No. 5,053,722. The difference is in how the high and the low band signals are generated. In this approach, the high band signals are generated by summing the microwave reference signal with one of the frequency synthesizer outputs, and the low band signal is generated by subtracting the microwave reference signal from the other frequency synthesizer output. By setting two frequency synthesizer outputs such that the sum of the two outputs equals the TD Offset frequency, the high and the low band frequencies will be separated by exactly the TD Offset frequency.

In the most efficient form of the invention, the bandwidth required in the microwave reference is approximately one-half the bandwidth of the TD signal minus the bandwidth of the frequency synthesizer. The bandwidth saving is evident from the following analysis. The TD bandwidth ("TD BW") is equal to the highband bandwidth ("HB BW") plus the lowband bandwidth ("LB BW") minus the overlap between HB and LB (the "Overlap BW"). For example, if HB=9−11 GHZ and LB=7−9 GHz, then TD BW=HB BW−Overlap BW=2 + 2−0=4 GHz. If HB=8.5−11 GHz and LB=7−9.5 GHz, then TD BW=2.5+2.5−1.0=4 GHz.

The LB BW equals the HB BW equals the microwave reference bandwidth ("REF BW") plus the frequency synthesizer bandwidth ("FS BW") because HB and LB are generated by summing or subtracting the frequency of the microwave reference signal and the frequency synthesizer signal. Therefore, $$REF\ BW = (TD\ BW + Overlap\ BW - 2\ FS\ BW)/2$$

For the most efficient form, the overlap between the high and low bands is eliminated, i.e., $$REF\ BW = (TD\ BW/2) - FS\ BW$$

Figure 3:
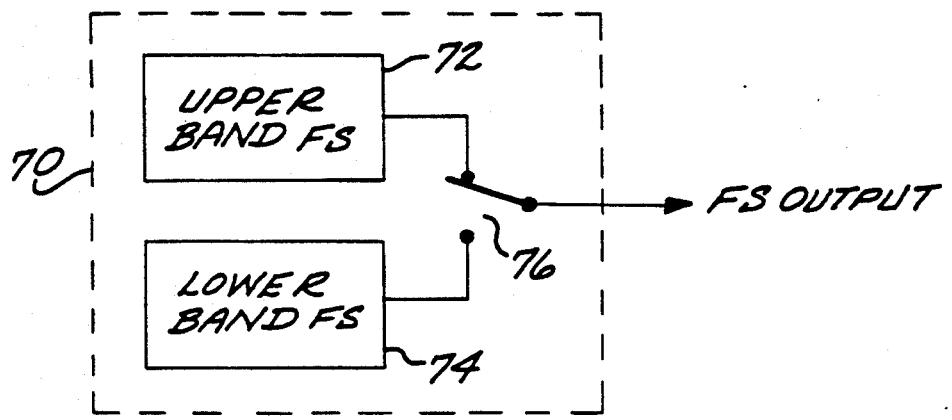
FIG. 3 is a simplified block diagram of a frequency synthesizer with a single output as divided into two synthesizers that generate the upper and lower half of a frequency band.

Although the invention requires two frequency synthesizer outputs, it will require hardware complexity of little more than the single frequency synthesizer. This is because the two frequency synthesizer outputs can be designed to share exactly the same frequency band and with the added constraint of having the sum of the frequencies of the two outputs must equal the TD offset frequency (a constant frequency), most of the hardware to generate a single frequency synthesizer output can be used to generate the second frequency synthesizer output. For example, a frequency synthesizer with a single output may be divided into two synthesizers that generate respectively the upper and lower half of the desired frequency band as shown in FIG. 3. Here, the frequency synthesizer 70 comprises an upper band synthesizer 72 and a lower band synthesizer 74 whose outputs are fed to a switch 76 to selected the desired upper band or lower band output as the synthesizer output.

Figure 4:
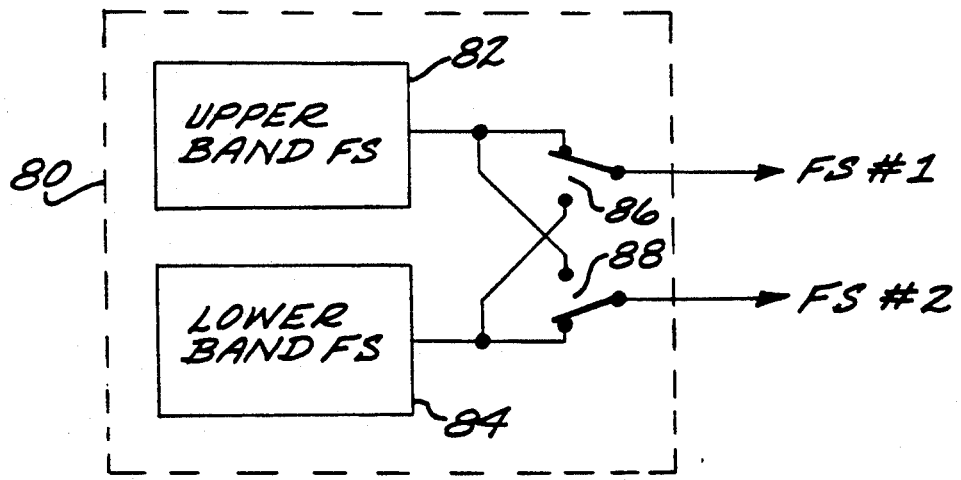
FIG. 4 is a simplified block diagram of a frequency synthesizer with two outputs.

A frequency synthesizer with two outputs that will meet the frequency requirement can be implemented using the general arrangement of FIG. 3 by adding another switch as shown in FIG. 4. Here, the synthesizer 80 comprises the upper band synthesizer 82 and lower band synthesizer 84 and respective switches 86 and 88 to provide the synthesizer outputs FS1 and FS2.

Figure 5:
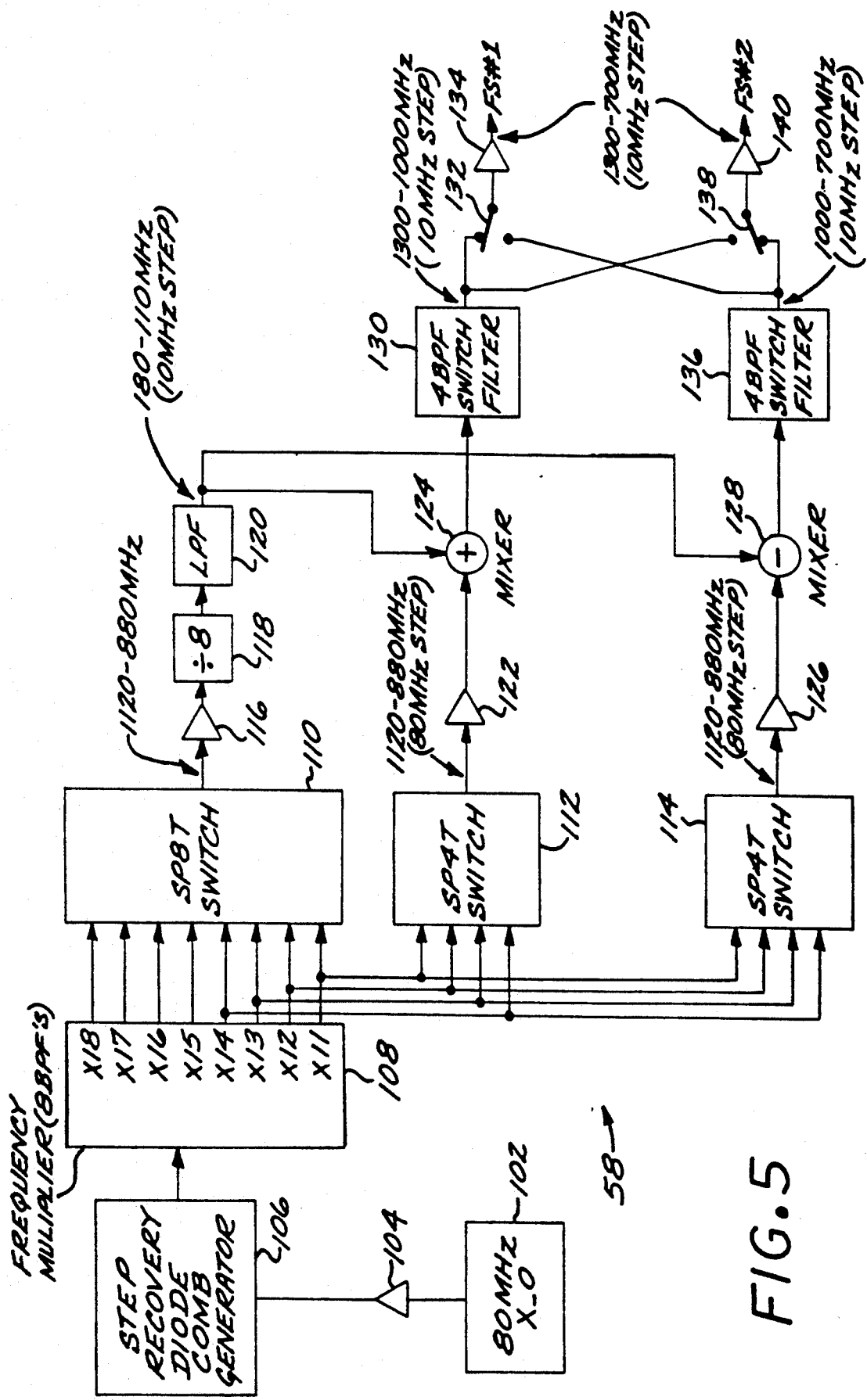
FIG. 5 is a block diagram of an exemplary frequency synthesizer embodying the invention.

FIG. 5 illustrates a block diagram of an exemplary frequency synthesizer which may be employed in the generator of FIG. 2. In this embodiment of synthesizer 58, a crystal oscillator 102 generates a stable frequency reference signal at 80 MHz. This signal is passed through amplifier 104 and step recovery diode comb generator 106, and fed to a frequency multiplexer 108 comprising eight bandpass filters to provide eight signals of different frequency multiples of the reference signal, in the range of 11 to 18 times the reference signal. The outputs of the multiplexer 108 are fed to a single pole, eight throw switch 110 and to single pole four throw switches 112 and 114. The selected frequency signal, in the range of 880 to 1440 MHz, is fed from switch 110 through an amplifier 116 to a divide-by-eight circuit 118. The output of the circuit 118 is then put through a low pass filter to provide a 110 to 180 MHz signal in ten MHz steps. This output signal is provided to mixers 124 and 128 to be mixed with amplified signals selected by respective switches 112 and 114. The output of mixer 130 is passed through bandpass switch filters 130, to provide an output in the frequency range of 1000 to 1300 MHz. The output of mixer 128 is fed to bandpass switch filters 136 to provide an output signal in the frequency range of 700 to 1000 MHz. Switches 132 and 138 select the appropriate switch filter output to be amplified by respective amplifiers 134 and 140 to be provided as frequency synthesizer signal FS1 and FS2.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A wide-band microwave signal generator for active radars, characterized in that respective separate transmit drive (TD) and receiver local oscillator (LO) signals are generated, the frequencies of said TD and LO signals being separated by a TD frequency offset, comprising:

a programmable reference signal generator for synthesizing a reference signal having a programmable first microwave frequency;

frequency synthesizing means for synthesizing first and second synthesized signals characterized in that the sum of the frequencies of said first and second synthesized signals is equal to said TD offset;

means for generating said TD and LO signals by mixing said first signal with said reference signal to obtain a signal whose frequency equals the sum of said first frequency and the frequency of said first signal to obtain a high frequency band signal, and by mixing said second signal with said reference signal to obtain a signal whose frequency equals the difference of said first frequency and the frequency of said second signal to obtain a low frequency band signal, whereby the frequencies of said high band and said low band signals are separated by exactly said TD offset frequency.

2. The generator of claim 1 further comprising means for selecting either said high band or said low band signals as said TD signal, and means for selecting the other of said high band or low band signals as said LO signal.

3. The generator of claim 2 wherein said selecting means for selecting said TD signal comprises a first switch for selecting either said high band or said low band signal, and said selecting means for selecting said LO signal comprises a second switch for selecting either said high band or said low band signal.

4. A wide-band microwave signal generator for active radars, characterized in that respective separate transmit drive (TD) and receiver local oscillator (LO) signals are generated, comprising:

a programmable reference signal generator for synthesizing a reference signal having a programmable first microwave frequency;

frequency synthesizing means for synthesizing first and second synthesized signals, said respective signals characterized in that the sum of the frequencies of said first and second synthesized signals is equal to a transmit drive (TD) offset;

first mixing means for mixing a selected one of said first or said second synthesized signals with said reference signal to obtain a first mixer output signal whose frequency equals the sum of the respective frequencies of said reference signal and said selected signal;

second mixing means for mixing the other of said first or second synthesized signals with said reference signal to obtain a second mixer output signal whose frequency equals the difference of the respective frequencies of said reference signal and said other of said first or second synthesized signals;

TD selection means for selecting said first mixer output signal or said second mixer output signal as the radar TD signal; and LO selection means for selecting first or said second mixer output signal as said receiver LO signal, such that said second mixer output signal is selected as said LO signal when said first mixer output signal is selected as said TD signal, and said first mixer output signal is selected as said LO signal when said second mixer output signal is selected as said TD signal, whereby the frequencies of said TD and LO signals are offset by said TD offset.

5. The signal generator of claim 4 wherein said frequency synthesizer means comprises:

means for synthesizing an upper frequency band signal;

means for synthesizing an lower frequency band signal;

means for selecting either said upper band synthesized signal or said low band synthesized signal as said first synthesized signal; and means for selecting either said upper band synthesized signal or said low band synthesized signal as said second synthesized signal, such that when said upper band signal is selected as said first synthesized signal, said lower band signal is selected as said second synthesized signal, and when said lower band signal is selected as said first synthesized signal, said upper band signal is selected as said second synthesized signal.

6. The generator of claim 5 wherein said means for selecting one of said upper or lower band synthesized signals as said first synthesized signal comprises a first switch, and said means for selecting one of said upper or lower band synthesized signals as said second synthesized signal comprises a second switch.

7. The generator of claim 4 wherein said TD selection means comprises a TD selection switch.

8. The generator of claim 4 wherein said LO selection means comprises an LO selection switch.

9. The generator of claim 4 wherein said radar is characterized by a TD signal bandwidth, said frequency synthesizing means is further characterized in that the frequencies of said first and second synthesized signals lie within a frequency synthesizer bandwidth, said reference signal generator is characterized by a reference signal frequency bandwidth within which said reference signal falls, and said reference signal frequency bandwidth is equal to one half said TD signal bandwidth minus frequency synthesizer bandwidth.

* * * * *